(12) United States Patent
Kaneko et al.

(10) Patent No.: US 8,750,017 B2
(45) Date of Patent: Jun. 10, 2014

(54) RESISTANCE-CHANGE MEMORY

(75) Inventors: Mizuki Kaneko, Yokohama (JP);
Tomoki Higashi, Yokohama (JP);
Tomonori Kurosawa, Zama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 317 days.

(21) Appl. No.: 13/358,677

(22) Filed: Jan. 26, 2012

(65) Prior Publication Data

US 2012/0243294 A1  Sep. 27, 2012

(30) Foreign Application Priority Data

Mar. 24, 2011  (JP) .................................. 2011-066183

(51) Int. Cl.
*G11C 11/00* (2006.01)

(52) U.S. Cl.
USPC ............................. 365/148; 365/158; 365/163

(58) Field of Classification Search
USPC ......... 365/46, 51, 52, 94, 100, 129, 148, 158, 365/163; 257/2–4, E21.35; 438/135
See application file for complete search history.

(56) References Cited

U.S. PATENT DOCUMENTS

| | | |
|---|---|---|
| 2006/0181915 A1 | 8/2006 | Oh et al. |
| 2011/0026301 A1* | 2/2011 | Ozawa .......................... 365/148 |
| 2011/0051495 A1* | 3/2011 | Ito ................................. 365/148 |
| 2011/0204309 A1* | 8/2011 | Nitta ................................. 257/2 |
| 2011/0235394 A1 | 9/2011 | Sasaki et al. |

FOREIGN PATENT DOCUMENTS

JP  2006-228414  8/2006

* cited by examiner

*Primary Examiner* — Harry W Byrne
(74) *Attorney, Agent, or Firm* — Oblon, Spivak, McClelland, Maier & Neustadt, L.L.P.

(57) ABSTRACT

According to one embodiment, a resistance-change memory includes bit lines, word lines, a memory cell array including memory cells arranged at intersections between the bit lines and the word lines, each of the memory cells including a variable-resistance element and a diode, a control circuit configured to apply a reverse bias to the diode, and to write data to a selected memory cell, and a current limiting circuit configured to limit a current flowing to the selected memory cell in a write. The current limiting circuit controls the current flowing to the selected memory cell not to exceed a second compliance current obtained by adding a leakage current from an unselected memory cell to a predetermined first compliance current.

11 Claims, 9 Drawing Sheets

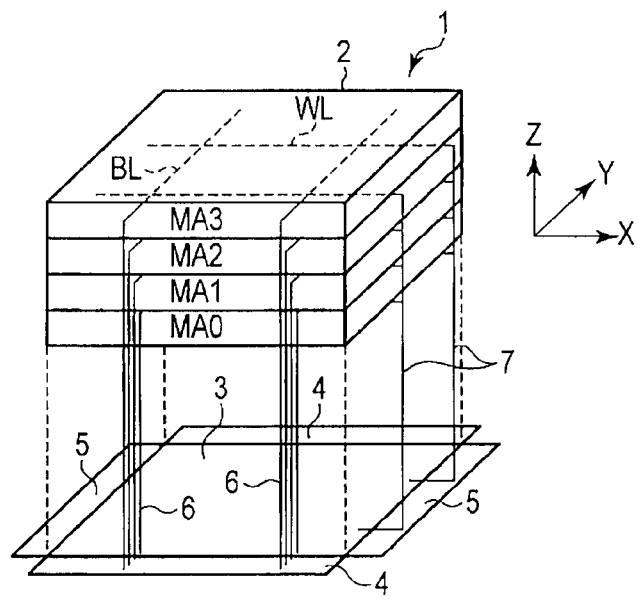
F I G. 1
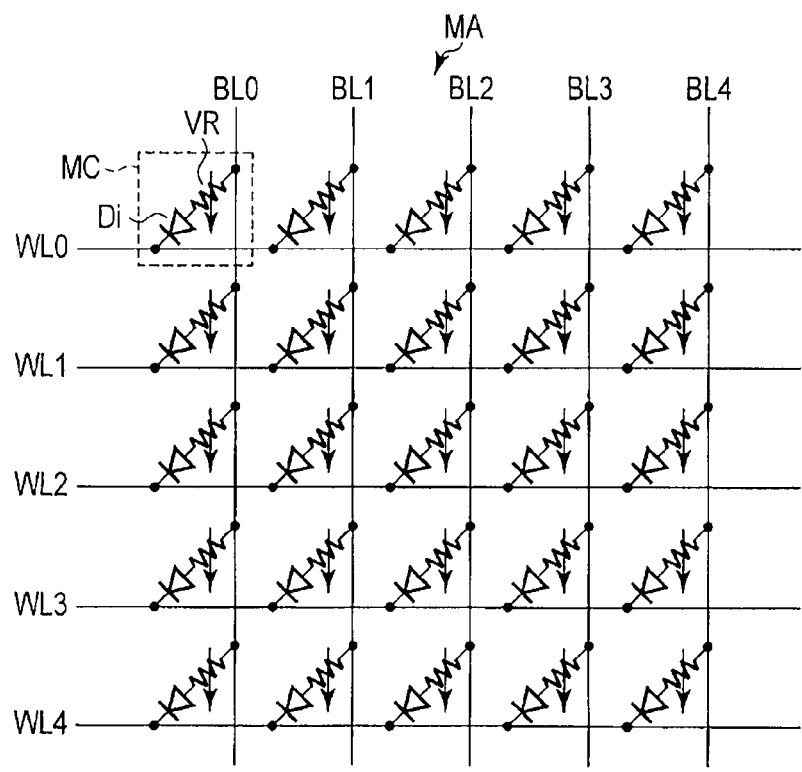
F I G. 2

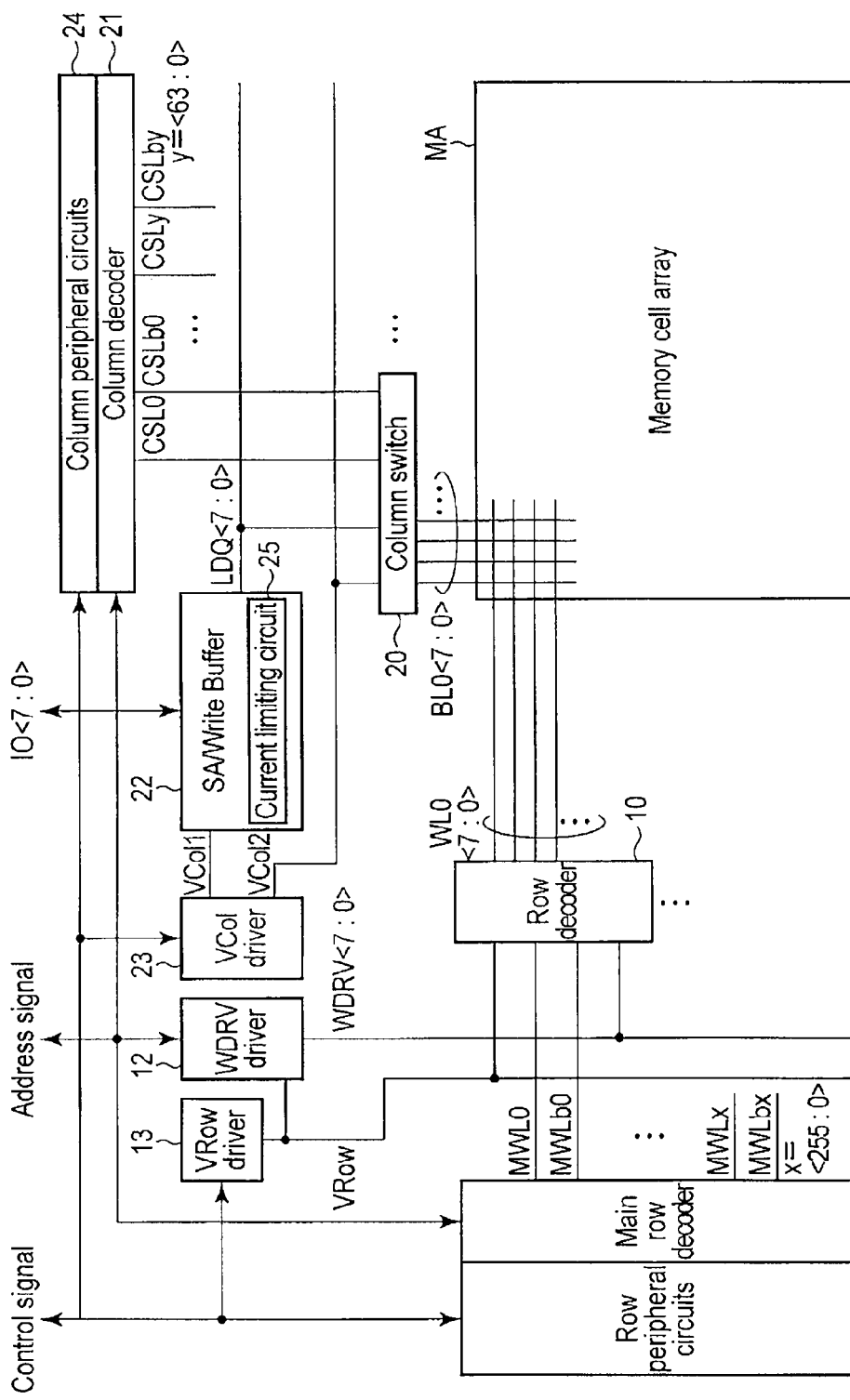
F I G. 3

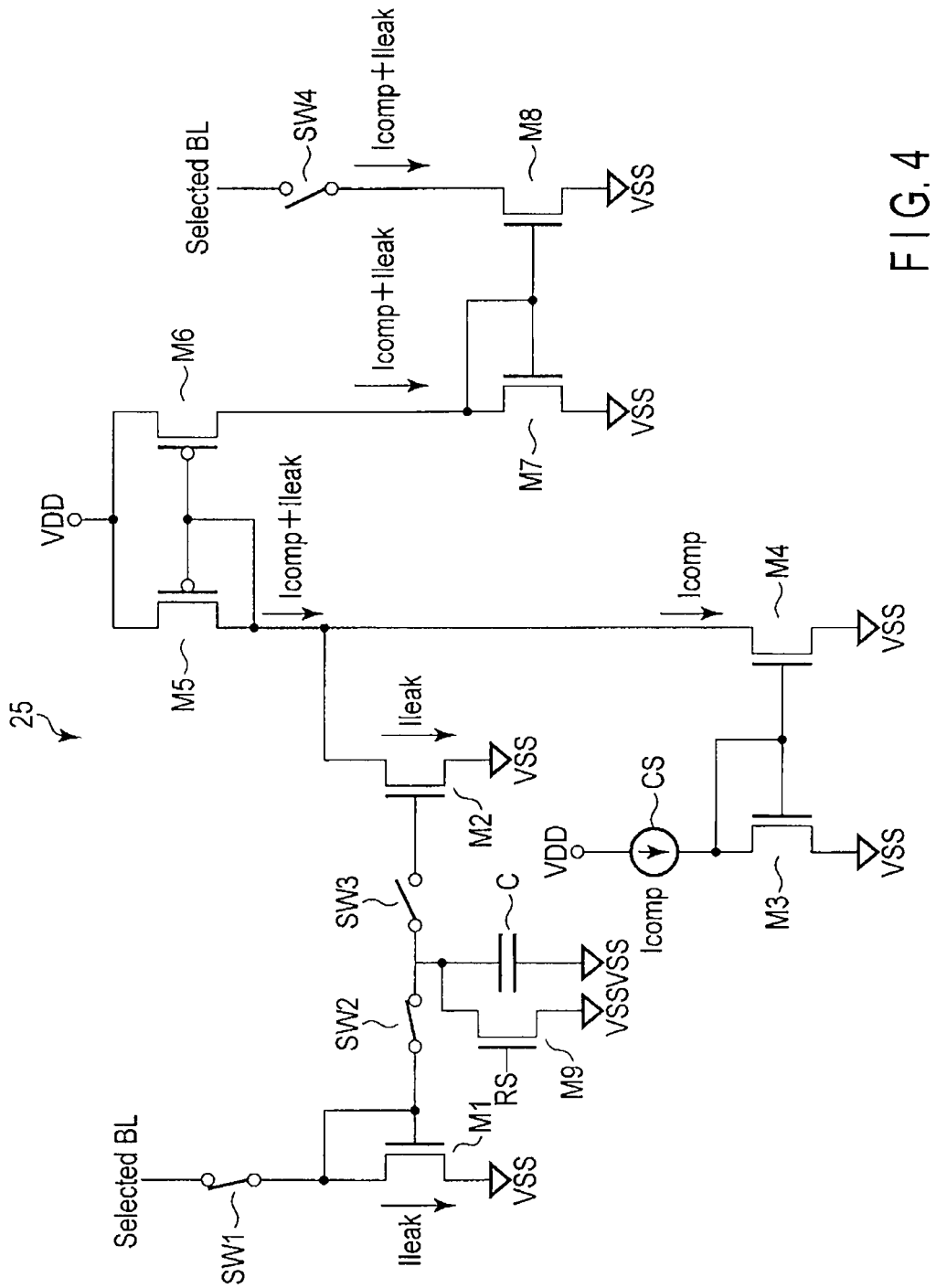
F I G. 4

F I G. 7

RESISTANCE-CHANGE MEMORY

CROSS-REFERENCE TO RELATED APPLICATIONS

This application is based upon and claims the benefit of priority from prior Japanese Patent Application No. 2011-066183, filed Mar. 24, 2011, the entire contents of which are incorporated herein by reference.

FIELD

Embodiments described herein relate generally to a resistance-change memory.

BACKGROUND

In recent years, a resistance-change memory has received a great deal of attention as a candidate to succeed the flash memory. For example, a resistive RAM (ReRAM) is known as a resistance-change memory using a variable-resistance element formed by sandwiching a recording layer made of a transition metal oxide or the like between two electrodes.

The variable-resistance element of the resistance-change memory has two kinds of operation modes. In one mode, the polarity of an applied voltage is switched to set a high-resistance state and a low-resistance state. This operation is called a bipolar type. In the other mode, the voltage and the voltage application time are controlled without switching the polarity of the applied voltage, thereby setting a high-resistance state and a low-resistance state. This operation is called a unipolar type.

Each memory cell included in the resistance-change memory is formed by, for example, connecting a variable-resistance element and a diode in series between a bit line and a word line. To write-access a selected memory cell connected to a selected bit line and a selected word line, a predetermined voltage is applied between the selected bit line and the selected word line to cause a predetermined current to flow to the selected memory cell.

However, a plurality of unselected memory cells are also connected to the selected bit line in addition to the selected memory cell. Depending on the bias applied to the unselected memory cells, a leakage current derived from the unselected memory cells flows to the selected bit line. Hence, in the write, a current corresponding to a difference obtained by subtracting the leakage current from the originally set specified value is actually supplied to the selected memory cell. This makes it difficult to change the resistance state of the selected memory cell.

BRIEF DESCRIPTION OF THE DRAWINGS

FIG. 1 is a schematic view showing the basic arrangement of a resistance-change memory according to the embodiment;

FIG. 2 is a circuit diagram of a memory cell array included in the resistance-change memory;

FIG. 3 is a block diagram of a column control circuit and a row control circuit of the resistance-change memory;

FIG. 4 is a circuit diagram of a current limiting circuit;

FIG. 7 is a view for explaining voltages applied to the bit lines and the word lines in stage 2;

DETAILED DESCRIPTION

Figure 5:
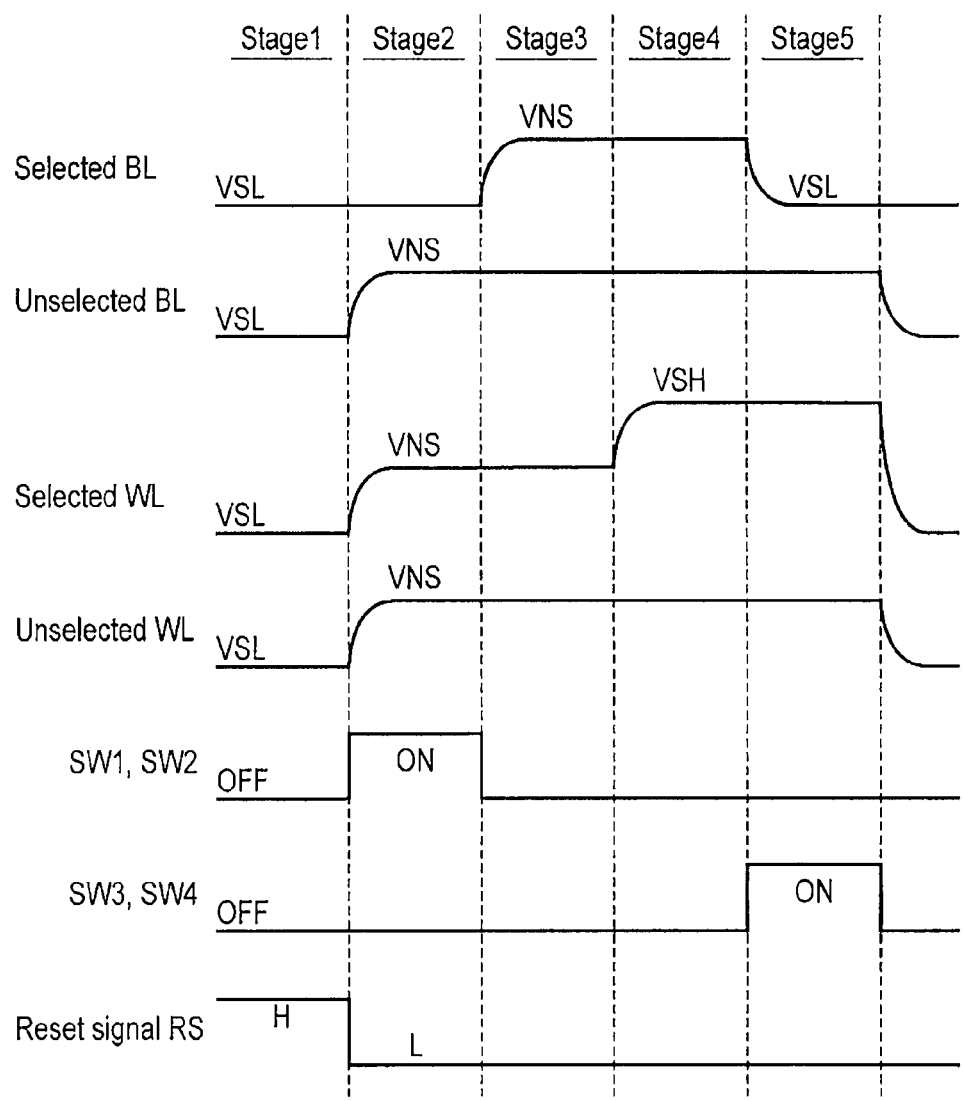
FIG. 5 is a timing chart showing a write to the resistance-change memory.

In general, according to one embodiment, there is provided a resistance-change memory comprising:
bit lines;
word lines configured to intersect the bit lines;
a memory cell array including memory cells arranged at intersections between the bit lines and the word lines, each of the memory cells including a variable-resistance element and a diode connected in series between a bit line and a word line;
a control circuit configured to apply a reverse bias to the diode, and to write data to a selected memory cell connected to a selected word line and a selected bit line; and
a current limiting circuit configured to limit a current flowing to the selected memory cell in a write,
wherein the current limiting circuit controls the current flowing to the selected memory cell not to exceed a second compliance current obtained by adding a leakage current from an unselected memory cell connected to the selected bit line to a predetermined first compliance current.

The embodiments will be described hereinafter with reference to the accompanying drawings. In the description which follows, the same or functionally equivalent elements are denoted by the same reference numerals, to thereby simplify the description.

[1. Arrangement of Resistance-Change Memory 1]

FIG. 1 shows the basic arrangement of a resistance-change memory 1 according to this embodiment, that is, the arrangement of an interconnection area 3 where interconnections such as a global bus are formed on a semiconductor substrate, and a memory block 2 stacked on it.

In this example, the memory block 2 includes four layers of memory cell arrays MA0 to MA3, as shown in FIG. 1. The interconnection area 3 is provided on the semiconductor substrate immediately under the memory block 2. The interconnection area 3 includes, for example, a global bus that transmits/receives, to/from an external device, data read from or to be written to the memory block 2. The interconnection area 3 may also include a column control circuit including a column switch and a row control circuit including a row decoder to be described later.

To connect a plurality of word lines WL and a plurality of bit lines BL disposed on each of the plurality of stacked memory cell arrays MA to the interconnection area 3 formed on the semiconductor substrate, vertical interconnections (via contacts) are necessary on the side surfaces of the memory block 2. Bit-line contact areas 4 and word-line contact areas 5 are provided on the four sides of the interconnection area 3. Bit-line contacts 6 and word-line contacts 7 to connect the bit lines BL and the word lines WL to the control circuits are formed in the bit-line contact areas 4 and the word-line contact areas 5, respectively. One end of each word line WL is connected to the interconnection area 3 via a corresponding word-line contact 7 formed in the word-line contact area 5. One end of each bit line BL is connected to the interconnection area 3 via a corresponding bit-line contact 6 formed in the bit-line contact area 4.

FIG. 1 illustrates one memory block 2 in which the plurality of memory cell arrays MA are stacked in a direction (Z direction in FIG. 1) perpendicular to the semiconductor substrate. Actually, a plurality of such memory blocks 2 are arranged in a matrix in the longitudinal direction (X direction in FIG. 1) of the word lines WL and the longitudinal direction (Y direction in FIG. 1) of the bit lines BL.

In this embodiment, the word lines WL of all layers are connected to the interconnection area 3 via only one line of contacts, that is, the word lines WL of all layers on one cross section are connected to the interconnection area 3 via a common contact in the word-line contact area 5. In addition, the bit lines BL of the respective layers are connected to the interconnection area 3 via four lines of contacts prepared independently in the bit-line contact area 4. In this embodiment, the bit lines BL are driven independently on the layer basis, and the word lines WL are commonly connected in all layers. However, the word lines WL may also be driven independently on the layer basis. Alternatively, the bit lines BL may be commonly connected, and the word lines WL may be driven independently. Upper and lower layers may share at least either of the bit lines BL and the word lines WL.

FIG. 2 is a circuit diagram of the memory cell array MA included in the resistance-change memory 1. The memory cell array MA shown in FIG. 2 includes, for example, 2-Kbit (2,048) memory cells MC arranged in the longitudinal direction (Y direction in FIG. 2) of the bit lines BL and, for example, 512-bit memory cells MC arranged in the longitudinal direction (X direction in FIG. 2) of the word lines WL. Hence, 1-Mbit (about $10^6$) memory cells MC are arranged in one memory cell array MA. In one memory cell array MA, the memory cells MC are arrayed in a two-dimensional matrix. Note that in FIG. 2, the memory cells MC connected to five word lines WL0 to WL4 and five bit lines BL0 to BL4 are extracted. The resistance-change memory cell MC formed by connecting a diode D1 serving as a rectifying element and a variable-resistance element VR in series is arranged at each intersection between the word lines WL and the bit lines BL.

One terminal of the variable-resistance element VR is connected to a bit line; the other terminal, to the anode of the diode D1. The cathode of the diode D1 is connected to the word lines WL. Note that the arrangement and polarity of the diode D1 and the variable-resistance element VR that form the memory cell MC are not limited to those illustrated.

The variable-resistance element VR has, for example, a stacked structure of an electrode/transition metal oxide/electrode, wherein the resistance of the metal oxide changes in accordance with voltage, current, or temperature (heat) such that data is nonvolatilely stored as different resistance states. More specifically, a resistive RAM (ReRAM) whose resistance changes on application of a voltage or current is used as the variable-resistance element VR. ReRAMs include, for example, a device that changes resistance based on the presence/absence of charges trapped by a charge trap in an electrode interface and a device that changes resistance based on the presence/absence of a conductive path generated by oxygen deficiency or the like.

The ReRAM of this embodiment is a bipolar ReRAM. That is, the polarity of the voltage to be applied to the memory cell MC is switched to set a high-resistance state and a low-resistance state. In the bipolar ReRAM, the diode D1 can be forward biased and reverse biased. Hence, the diode D1 is required to allow a sufficient current to flow not only when forward biased but also when reverse biased. That is, in the bipolar type, the diode of a memory cell is designed to ensure sufficient current when reverse biased compared to the diode of a memory cell that operates in the unipolar mode.

Applying a voltage to the memory cell MC so as to apply a negative voltage (reverse bias) to the diode Di is called a write. In a write, the variable-resistance element VR changes from the high-resistance state to the low-resistance state. On the other hand, applying a voltage to the memory cell MC so as to apply a positive voltage (forward bias) to the diode D1 is called an erase. In an erase, the variable-resistance element VR changes from the low-resistance state to the high-resistance state. When causing a current to flow to the diode D1 by a reverse bias, the yield phenomenon is exploited. For this reason, the negative voltage applied to the diode D1 for reverse bias has an absolute value larger than that of the positive voltage applied for forward bias. That is, the voltage and current applied to the memory cell MC during a write have larger absolute values than those during an erase. Hence, the leakage current from the memory cell MC is inevitably larger during a write than during an erase.

<Arrangement of Control Circuit>

An example of the arrangement of a column control circuit and a row control circuit which control the voltages of the bit lines BL and the word lines WL will be described next. In the example to be described below, 2-Kbit (=2,048 bits) memory cells MC are arrayed in the word-line direction, and 512-bit memory cells MC are arrayed in the bit-line direction so as to form a 1-Mbit memory cell array MA. FIG. 3 is a block diagram of the column control circuit and the row control circuit of the resistance-change memory 1.

As shown in FIG. 3, the row control circuit comprises, for example, a row decoder 10, a main row decoder 11, a WDRV driver 12, a VRow driver 13, and row peripheral circuits 14. The column control circuit comprises, for example, a column switch 20, a column decoder 21, an SA/write buffer 22, a VCol driver 23, and column peripheral circuits 24.

The word lines of this embodiment have a hierarchical structure. The main row decoder 11 selectively drives one of 256 pairs of main word lines MWLx and MWLbx (x=<255:0>). In the selected pair of main word lines MWLx and MWLbx, the main word line MWLx goes high, and the main word line MWLbx goes low. Conversely, in each unselected pair of main word lines MWLx and MWLbx, the main word line MWLx goes low, and the main word line MWLbx goes high. One pair of main word lines MWLx and MWLbx is connected to the row decoder 10. The row decoder 10 selectively drives one of eight word lines WLx<7:0> under the pair of main word lines MWLx and MWLbx. The row decoder 10 connected to the pair of main word lines MWLx and MWLbx selectively driven by the main row decoder 11 further selectively drives the word line WL, thereby selectively driving one word line WL.

Eight write driving lines WDRV<7:0> and a row power supply line VRow are connected to the WDRV driver 12. The row power supply line VRow is connected to the VRow driver 13. A voltage to be applied to the word lines WL under the unselected pairs of main word lines MWLx and MWLbx and the unselected word lines WL under the selected pair of main word lines MWLx and MWLbx is applied to the row power supply line VRow. The write driving lines WDRV<7:0> and the row power supply line VRow are connected to the row decoder 10. A voltage to cause the row decoder 10 to drive the word line WL is applied to the write driving lines WDRV<7:0> and the row power supply line VRow. The row peripheral circuits 14 manage the entire resistance-change memory 1. The row peripheral circuits 14 receive control signals from an external host device and perform read, write, erase, data input/output management, and the like.

The bit lines of this embodiment also have a hierarchical structure. The column decoder 21 selectively drives one of 64 pairs of column selection lines CSLy and CSLby (y=<63:0>). In the selected pair of column selection lines CSLy and CSLby, column selection line CSLy goes high, and column selection line CSLby goes low. Conversely, in each unselected pair of column selection lines CSLy and CSLby, column selection line CSLy goes low, and column selection line CSLby goes high. One pair of column selection lines CSLy and CSLby is connected to the column switch 20. The column switch 20 selectively drives one of eight bit lines BLy<7:0> under the pair of column selection lines CSLy and CSLby. The column switch 20 connected to the pair of column selection lines CSLy and CSLby selectively driven by the column decoder 21 further selectively drives the bit line BL, thereby selectively driving one bit line BL.

The SA/write buffer 22 senses and amplifies signals read to local data lines LDQ<7:0> and supplies write data input from data input/output lines 10<7:0> to the memory cells MC via the column switch 20. The eight local data lines LDQ<7:0> and a column power supply line VCol1 are connected to the SA/write buffer 22. Column power supply lines VCol1 and VCol2 are connected to the VCol driver 23. The local data lines LDQ<7:0> and column power supply line VCol2 are connected to the column switch 20. A voltage to cause the column switch 20 to drive the bit line BL is applied to the local data lines LDQ<7:0> and column power supply line VCol2. The column peripheral circuits 24 manage the entire resistance-change memory 1. The column peripheral circuits 24 receive control signals from an external host device and perform read, write, erase, data input/output management, and the like.

<Arrangement of Current Limiting Circuit 25>

An example of the arrangement of a current limiting circuit 25 shown in FIG. 3 will be explained next. The current limiting circuit 25 is included in, for example, the SA/write buffer 22. The current limiting circuit 25 controls to prevent the maximum current flowing to the memory cell MC from exceeding a predetermined value during a write. That is, in a write, the selected memory cell MC changes from the high-resistance state to the low-resistance state. Hence, upon changing to the low-resistance state, a large current flows between the selected word line WL and the selected bit line BL via the selected memory cell MC. In the ReRAM, a function of preventing such a large current from flowing to the selected memory cell MC is necessary, and the current limiting circuit 25 has this function.

FIG. 4 is a circuit diagram of the current limiting circuit 25. One terminal of a switch SW1 is connected to the selected bit line BL via the local data lines LDQ<7:0> and the column switch 20. The other terminal of switch SW1 is connected to the drain of an n-channel MOS transistor (nMOS transistor) M1.

The nMOS transistor M1 has its gate connected to its drain and its source grounded. The gate of nMOS transistor M1 is also connected to one electrode of a capacitor C via a switch SW2. The other electrode of the capacitor C is grounded. An nMOS transistor M9 has its drain connected to one electrode of the capacitor C, its gate arranged to receive a reset signal RS input from the column peripheral circuits 24, and its source grounded. The nMOS transistor M9 has a function of discharging (resetting) the capacitor C.

A p-channel MOS transistor (pMOS transistor) M5 has its source connected to a power supply terminal VDD, and its gate connected to its drain. A pMOS transistor M6 has its source connected to the power supply terminal VDD, and its gate connected to the gate of pMOS transistor M5. An nMOS transistor M2 has its drain connected to the drain of pMOS transistor M5, its gate connected to one electrode of the capacitor C via a switch SW3, and its source grounded.

A constant current source CS is configured to cause a constant current (compliance current) Icomp to flow. The compliance current Icomp is set to a value capable of preventing a current from abruptly or excessively flowing to the memory cell MC and degrading or destroying the memory cell MC in the process of applying a voltage to the memory cell MC to change its resistance state. The compliance current Icomp is optimally designed in accordance with the materials and sizes of the variable-resistance element VR and the diode D1. For the compliance current Icomp generated by the constant current source CS, the leakage current from unselected memory cells other than the selected memory cell is not taken into consideration.

An nMOS transistor M3 has its drain connected to the constant current source CS, its gate connected to its drain, and its source grounded. An nMOS transistor M4 has its drain connected to the drain of pMOS transistor M5, its gate connected to the gate of nMOS transistor M3, and its source grounded.

An nMOS transistor M7 has its drain connected to the drain of pMOS transistor M6, its gate connected to its drain, and its source grounded. An nMOS transistor M8 has its drain connected to one terminal of a switch SW4. The other terminal of switch SW4 is connected to the selected bit line BL via the local data lines LDQ<7:0> and the column switch 20. The nMOS transistor M8 also has its gate connected to the gate of nMOS transistor M7, and its source grounded. The column peripheral circuits 24 on/off-control switches SW1 to SW4.

The nMOS transistors M1 and M2 constitute a current mirror circuit. Hence, the same current as a leakage current Ileak flowing to nMOS transistor M1 flows to nMOS transistor M2. The nMOS transistors M3 and M4 constitute a current mirror circuit. Hence, the same current as the compliance current Icomp flowing to nMOS transistor M3 flows to nMOS transistor M4.

The pMOS transistors M5 and M6 constitute a current mirror circuit. A current corresponding to the sum of the leakage current Ileak flowing to nMOS transistor M2 and the compliance current Icomp flowing to nMOS transistor M4 flows to pMOS transistor M5. Hence, the same current as the current (Icomp+Ileak) flowing to pMOS transistor M5 flows to pMOS transistor M6. The nMOS transistors M7 and M8 constitute a current mirror circuit. Hence, the same current as the current (Icomp+Ileak) flowing to nMOS transistor M7 flows to nMOS transistor M8.

[2. Operation]

A write to the resistance-change memory 1 will be described next. Writing changes the variable-resistance element VR from the high-resistance state to the low-resistance state. In the write, a high-level voltage is applied to the selected word line WL out of the selected word line WL and the selected bit line BL connected to the selected memory cell MC. A low-level voltage is applied to the selected bit line BL. A negative voltage (reverse bias) is applied to the diode D1 so as to apply the write voltage to the variable-resistance element VR.

Figure 6:
FIG. 6 is a view for explaining voltages applied to the bit lines and the word lines in stage 1.

FIG. 5 is a timing chart showing a write to the resistance-change memory 1. In this embodiment, the write is performed in five stages (stages 1 to 5). FIG. 6 is a view for explaining voltages applied to the bit lines and the word lines in stage 1. Assume that data is written to the circled memory cell in FIG. 6. The circled memory cell will be referred to as a selected memory cell. The word line and the bit line connected to the selected memory cell will be referred to as a selected word line and a selected bit line, respectively.

Let VSL be the voltage (selected-bit-line voltage) applied to the selected bit line, VSH be the voltage (selected-word-line voltage) applied to the selected word line, and VNS be the voltage (nonselection voltage) applied to the unselected bit lines and the unselected word lines. The magnitude relationship between these voltages is VSL<VNS<VSH. For example, the nonselection voltage VNS is set to an intermediate voltage between the selected-bit-line voltage VSL and the selected-word-line voltage VSH. The selected-bit-line voltage VSL is, for example, zero.

First, in stage 1, the row control circuit and the column control circuit apply the selected-bit-line voltage VSL to all bit lines and all word lines. In stage 1, the column control circuit turns off switches SW1 to SW4. The column control circuit makes the reset signal RS high and turns on nMOS transistor M9. The charges in the capacitor C are thus removed (reset).

In stage 2, the row control circuit and the column control circuit apply the nonselection voltage VNS to the unselected bit lines and all word lines. The selected bit line maintains the selected-bit-line voltage VSL. In stage 2, the column control circuit turns on switches SW1 and SW2, turns off switches SW3 and SW4, and makes the reset signal RS low. The selected bit line is thus connected to nMOS transistor M1 and the capacitor C.

FIG. 7 is a view for explaining voltages applied to the bit lines and the word lines in stage 2. Because of the voltage relationship in stage 2, the unselected memory cells connected to the selected bit line are reverse biased. In this embodiment, since the nonselection voltage VNS is set to an intermediate voltage between the selected-bit-line voltage VSL and the selected-word-line voltage VSH, a negative voltage having a magnitude of |VNS-VSL| is applied to the unselected memory cells connected to the selected bit line. This equals the negative voltage applied to the unselected memory cells connected to the selected bit line in stage 5 to be described later. Hence, measuring the current amount of the selected bit line in stage 2 allows to measure the total leakage current generated by the unselected memory cells connected to the selected bit line when writing data to the selected memory cell in stage 5. The leakage current flowing to the selected bit line charges the capacitor C in FIG. 4.

Figure 8:
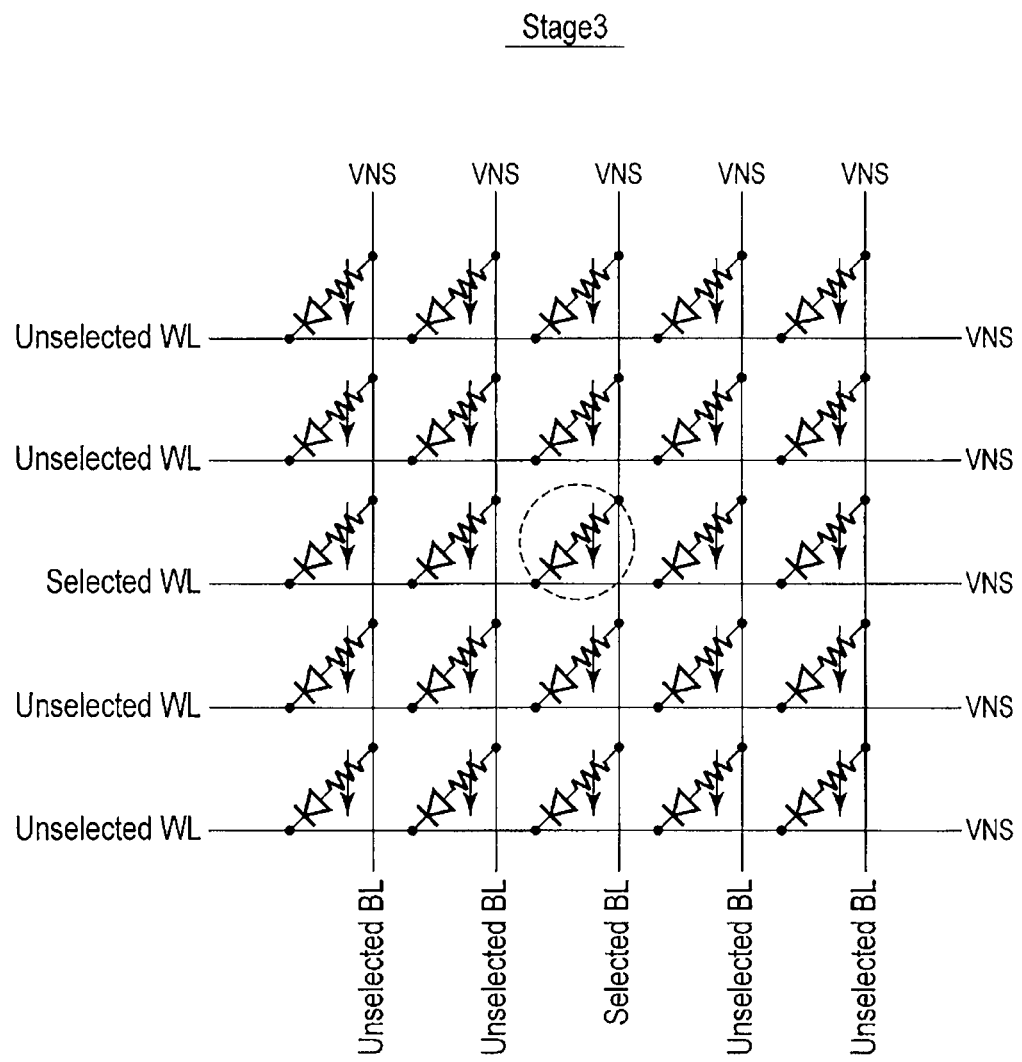
FIG. 8 is a view for explaining voltages applied to the bit lines and the word lines in stage 3.

In stage 3, the column control circuit applies the nonselection voltage VNS to the selected bit line. That is, in stage 3, the nonselection voltage VNS is applied to all bit lines and all word lines. In stage 3, the column control circuit turns off switches SW1 to SW4. FIG. 8 is a view for explaining voltages applied to the bit lines and the word lines in stage 3. The capacitor C thus stores the voltage (or charges) generated by the leakage current in stage 2.

Figure 9:
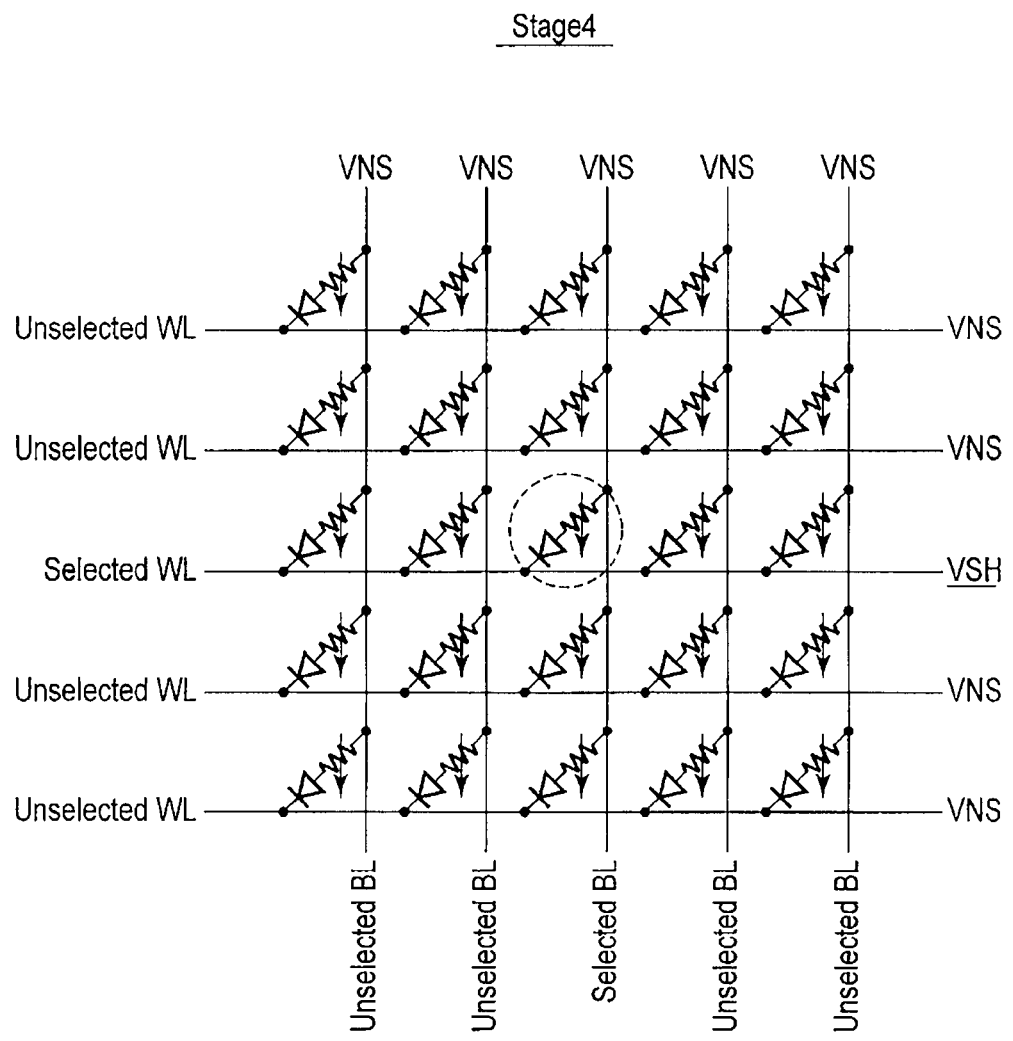
FIG. 9 is a view for explaining voltages applied to the bit lines and the word lines in stage 4.

In stage 4, the row control circuit applies the selected-word-line voltage VSH to the selected word line. FIG. 9 is a view for explaining voltages applied to the bit lines and the word lines in stage 4.

Figure 10:
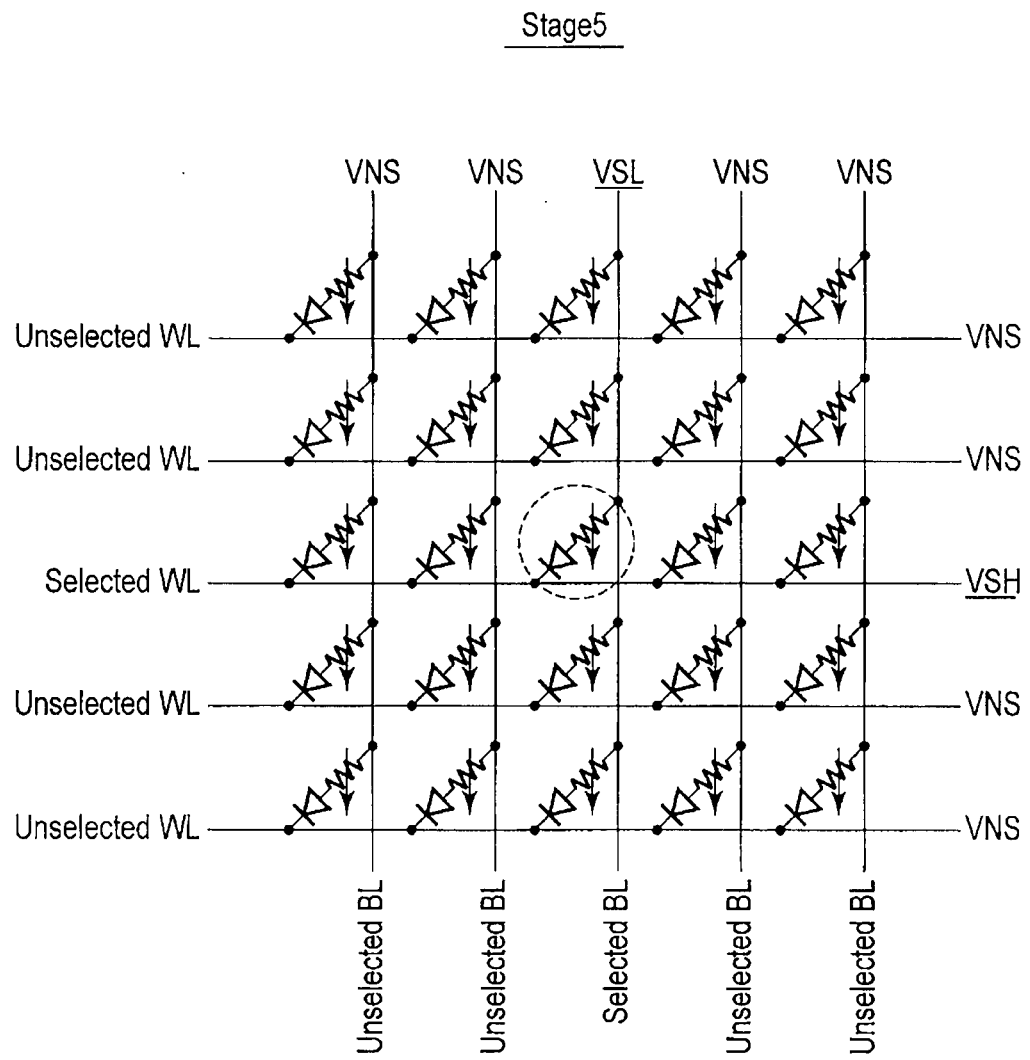
FIG. 10 is a view for explaining voltages applied to the bit lines and the word lines in stage 5.

In stage 5, the column control circuit applies the selected-bit-line voltage VSL to the selected bit line. In stage 5, the column control circuit turns on switches SW3 and SW4. The capacitor C is thus connected to nMOS transistor M2, and the selected bit line is connected to nMOS transistor M8. FIG. 10 is a view for explaining voltages applied to the bit lines and the word lines in stage 5.

Because of the voltage relationship in stage 5, a negative voltage having a magnitude of |VSH-VSL| is applied to the selected memory cell so that the selected memory cell is set in the write state (low-resistance state). In addition, a negative voltage having a magnitude of |VNS-VSL| is applied to the unselected memory cells connected to the selected bit line so that the unselected memory cells are set in a half-selected state. However, since the voltage is low, the write is prohibited.

Additionally, in stage 5, the voltage of the capacitor C is applied to the gate of nMOS transistor M2. For this reason, almost the same current as the leakage current Ileak flowing to the selected bit line in stage 2 flows to nMOS transistor M2, and nMOS transistor M2 functions to add the leakage current Ileak to the compliance current Icomp. Hence, the drain current of pMOS transistor M5 is Icomp+Ileak. This current is mirrored so that Icomp+Ileak is set in the selected bit line as a new compliance current. As a result, the write to the selected memory cell is done using the new compliance current Icomp+Ileak as the maximum current.

[3. Effects]

As described above in detail, in the resistance-change memory 1 according to this embodiment, the control circuit (row control circuit and column control circuit) reverse biases the diode D1 to write to the selected memory cell connected to the selected bit line and the selected word line. In the write, the selected-bit-line voltage VSL is applied to the selected bit line, the selected-word-line voltage VSH is applied to the selected word line, and the nonselection voltage VNS is applied to the unselected bit lines and the unselected word lines. The magnitude relationship between these voltages is VSL<VNS<VSH. Before writing data to the selected memory cell, the control circuit applies the selected-bit-line voltage VSL to the selected bit line and the nonselection voltage VNS to the unselected bit lines and all word lines, thereby reproducing the leakage current Ileak flowing from the unselected memory cells connected to the selected bit line to the selected bit line in the write. The current limiting circuit 25 stores the leakage current Ileak. In the write, the current limiting circuit 25 limits the maximum current so as not to exceed the new compliance current Icomp+Ileak obtained by adding the leakage current Ileak to the predetermined compliance current Icomp.

Hence, according to this embodiment, it is possible to supply the optimum compliance current Icomp to the selected memory cell in the write. This allows the resistance state of the selected memory cell to be accurately changed (from the high-resistance state to the low-resistance state, in this embodiment). In addition, the selected memory cell is not degraded or destroyed in the process of changing the resistance state of the selected memory cell.

If the compliance current correction described in this embodiment is not performed, a negative voltage having a magnitude of |VNS-VSL| is applied to the unselected memory cells during a write to the selected memory cell, and the leakage current Ileak is generated in the unselected memory cells. In this case, only a current corresponding to a difference obtained by subtracting the leakage current from the specified compliance current Icomp flows to the selected memory cell. This makes it difficult to accurately change the resistance state of the selected memory cell. In addition, when the size of the memory cell array MA increases, the number of unselected memory cells connected to the selected bit line increases as a matter of course, and the total leakage current from the unselected memory cells becomes large. This leads to a large decrease in the compliance current flowing to the selected memory cell in the write. Hence, this embodiment is more effective for the memory cell array MA having a larger size.

In this embodiment, in the write, the diode D1 is reverse biased with a voltage having a larger absolute value than that for forward bias. For this reason, in the write, the selected-word-line voltage VSH and the nonselection voltage VNS are large, and the leakage current of the memory cells is also inevitably large. Hence, this embodiment is effective for a resistance-change memory that reverse biases the diode D1 to write.

Note that compliance current correction need not be done for every write. For example, compliance current correction may be performed only after a predetermined number of writes.

This embodiment is not limited to writing by reverse biasing the diode D1 and may be applied to erasing by forward biasing the diode D1.

In this embodiment, an ReRAM has been exemplified as a resistance-change memory. However, the embodiment is not limited to this. A resistance-change memory such as a phase-change RAM (PCRAM) using, for instance, a chalcogenide, which changes resistance by changing between a crystalline phase and an amorphous phase, or a conductive bridging RAM (CBRAM), which changes resistance by depositing metal cations to form a contacting bridge between electrodes or ionizing the deposited metal to destroy the contacting bridge is also usable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance-change memory comprising:
bit lines;
word lines configured to intersect the bit lines;
a memory cell array including memory cells arranged at intersections between the bit lines and the word lines, each of the memory cells including a variable-resistance element and a diode connected in series between a bit line and a word line;
a control circuit configured to apply a reverse bias to the diode, and to write data to a selected memory cell connected to a selected word line and a selected bit line; and
a current limiting circuit configured to limit a current flowing to the selected memory cell in a write,
wherein the current limiting circuit controls the current flowing to the selected memory cell not to exceed a second compliance current obtained by adding a leakage current from an unselected memory cell connected to the selected bit line to a predetermined first compliance current.

2. The memory of claim 1, wherein the control circuit has a first stage for measuring the leakage current from the unselected memory cell, and a second stage for writing the data to the selected memory cell using the second compliance current.

3. The memory of claim 2, wherein the current limiting circuit stores the leakage current from the unselected memory cell in the first stage.

4. The memory of claim 2, wherein in the second stage, the control circuit applies a first voltage to the selected bit line, a second voltage higher than the first voltage to the selected word line, and an intermediate voltage between the first voltage and the second voltage to an unselected bit line and an unselected word line.

5. The memory of claim 4, wherein in the first stage, the control circuit applies the first voltage to the selected bit line, and the intermediate voltage to the selected word line, the unselected bit line, and the unselected word line.

6. The memory of claim 2, wherein the first stage and the second stage are performed during a write operation.

7. The memory of claim 1, wherein the current limiting circuit includes a current source configured to generate the first compliance current, and a capacitor configured to store the leakage current.

8. The memory of claim 7, wherein the current limiting circuit includes a circuit configured to add the leakage current stored in the capacitor to the first compliance current.

9. The memory of claim 7, wherein the current limiting circuit includes:
a first MOS transistor having a gate connected to the capacitor;
a second MOS transistor configured to cause the first compliance current to flow; and
a mirror circuit configured to add currents of the first MOS transistor and the second MOS transistor.

10. The memory of claim 1, wherein a resistance state of the variable-resistance element changes upon switching a polarity of an applied voltage.

11. The memory of claim 1, wherein the variable-resistance element includes a first electrode, a second electrode, and a variable-resistance film sandwiched between the first electrode and the second electrode.

* * * * *